US009082949B2

(12) United States Patent
Kontos et al.

(10) Patent No.: US 9,082,949 B2
(45) Date of Patent: *Jul. 14, 2015

(54) MAGNETIC MEMORY AND METHOD OF FABRICATION

(71) Applicant: Varian Semiconductor Equipment Associates, Inc., Gloucester, MA (US)

(72) Inventors: Alexander C. Kontos, Beverly, MA (US); Steven Sherman, Newton, MA (US); John J. Hautala, Beverly, MA (US); Simon Ruffell, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/872,888

(22) Filed: Apr. 29, 2013

(65) Prior Publication Data
US 2013/0288394 A1    Oct. 31, 2013

Related U.S. Application Data

(60) Provisional application No. 61/639,184, filed on Apr. 27, 2012.

(51) Int. Cl.
| *H01L 43/12* | (2006.01) |
| *H01L 27/22* | (2006.01) |
| *H01L 43/02* | (2006.01) |

(52) U.S. Cl.
CPC ............. *H01L 43/02* (2013.01); *H01L 27/222* (2013.01); *H01L 43/12* (2013.01)

(58) Field of Classification Search
CPC .............................. H01L 43/02; H01L 27/222
USPC ........... 438/3; 216/22; 257/E43.001, E43.006
See application file for complete search history.

(56) References Cited

U.S. PATENT DOCUMENTS

| 6,169,688 | B1* | 1/2001 | Noguchi ........................ 365/171 |
| 2001/0040778 | A1* | 11/2001 | Abraham et al. ........... 360/324.2 |
| 2009/0117735 | A1* | 5/2009 | Yin et al. ....................... 438/659 |
| 2009/0214898 | A1* | 8/2009 | Hinoue et al. .............. 428/848.5 |
| 2010/0053813 | A1* | 3/2010 | Fukushima et al. ........... 360/131 |
| 2011/0143170 | A1* | 6/2011 | Gouk et al. .................... 428/846 |
| 2013/0084653 | A1* | 4/2013 | Rubin et al. ....................... 438/3 |

FOREIGN PATENT DOCUMENTS

| EP | 0936624 A2 | 8/1999 |
| WO | 2005013376 A1 | 2/2005 |

OTHER PUBLICATIONS

Hautala, John, Patterning MRAM Devices by Ion Implant, U.S. Appl. No. 13/861,017, filed Apr. 11, 2013.
International Search Report and Written Opinion dated Nov. 22, 2013 for PCT/US2013/038680 filed Apr. 29, 2013.

* cited by examiner

*Primary Examiner* — Christine Enad

(57) ABSTRACT

A method of forming a magnetic memory includes providing a layer stack comprising a plurality of magnetic layers and a plurality of electrically conducting layers on a base portion of a substrate; forming a first mask feature on an outer surface of the layer stack above a first protected region and a second mask feature on the outer surface of the layer stack above a second protected region, the first mask feature and second mask feature defining an exposed region of the layer stack in portions of the layer stack therebetween; and directing ions towards exposed the region of the layer stack in an ion exposure that is effective to magnetically isolate the first protected region from the second protected region and to electrically isolate the first protected region from the second protected region without removal of the exposed region of the layer stack.

6 Claims, 8 Drawing Sheets

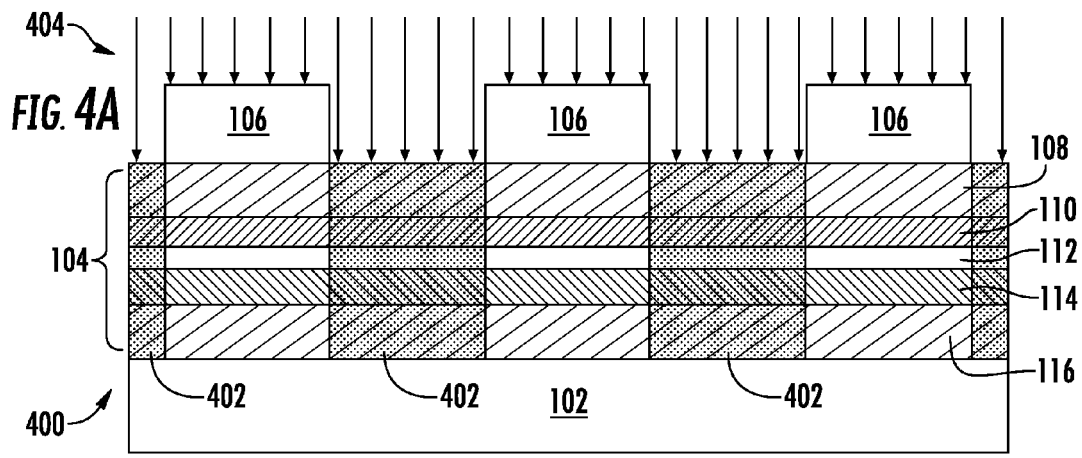
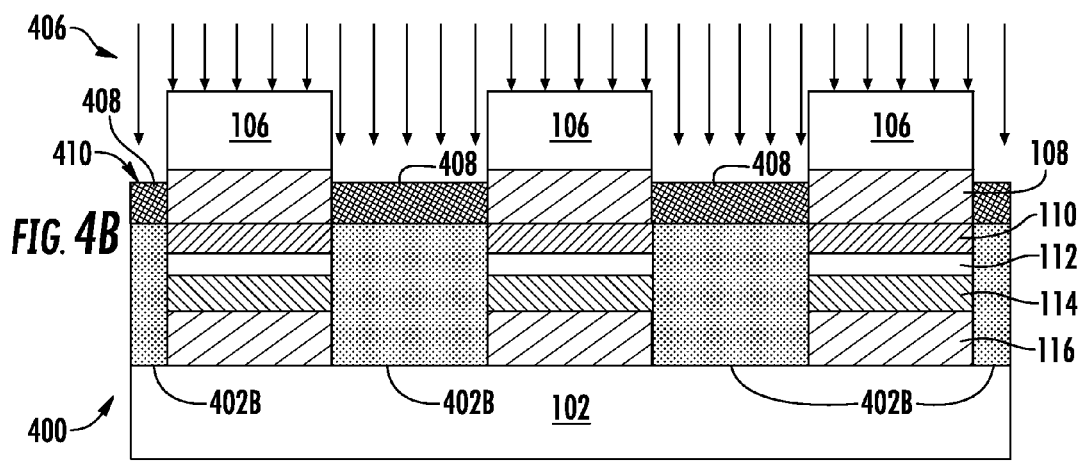
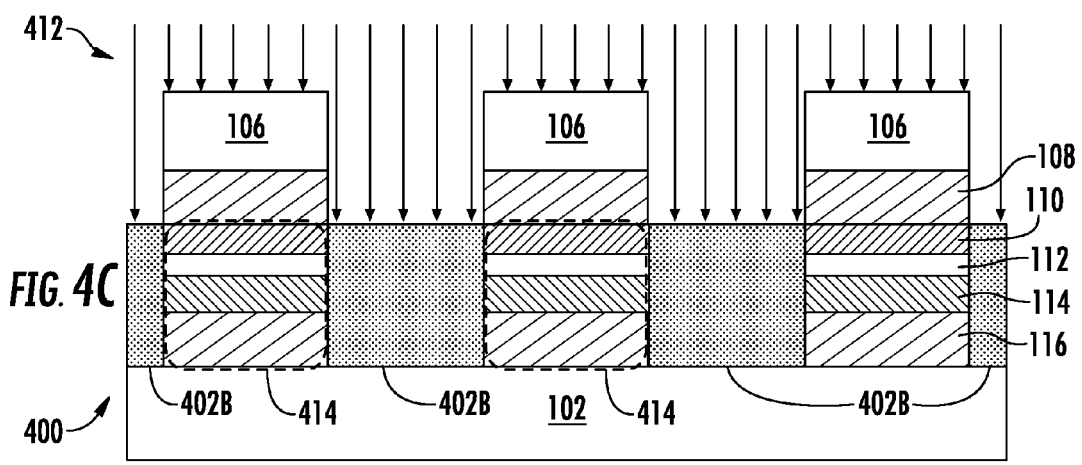

MAGNETIC MEMORY AND METHOD OF FABRICATION

RELATED APPLICATIONS

This application claims priority to U.S. provisional patent application No. 61/639,184 filed Apr. 27, 2012.

FIELD

Embodiments relate to the field of non-volatile storage. More particularly, the present embodiments relate to a magnetic memory and related fabrication techniques.

BACKGROUND

The fabrication of conventional storage media including non-volatile memory devices, faces many challenges as storage density increases and individual memory storage cell size decreases. Magnetic random access memory (MRAM) devices have several attractive features. Unlike conventional random access memory chip technologies, data in MRAM devices is not stored as electric charge or current flows, but rather by magnetic storage elements. Moreover, unlike dynamic random access memory, MRAM devices are all non-volatile and do not require refreshing to preserve the memory state of a cell.

An MRAM device may include storage elements formed from two ferromagnetic plates, each of which can hold a magnetic field, separated by a thin insulating layer. One of the two plates may be a permanent magnet set to a particular polarity and the other plate may have a field that can be changed to match that of an external field to store memory. This configuration is known as a "spin valve" and is the simplest structure for an MRAM bit cell. A memory device may be built from a grid of such "cells", such as a two dimensional array.

A recent variant of MRAM is a spin-transfer torque random-access memory, or STT-RAM which has the advantages of lower power consumption and better scalability over conventional magnetoresistive random access memory, which utilizes magnetic fields to flip the active elements. Spin-transfer torque is where the orientation of a magnetic layer in a magnetic tunnel junction or spin valve can be modified using a spin-polarized current. The effects are usually most evident in nanometer scale devices. Accordingly, as device sizes of non-volatile memories scale to sub 100 nm dimensions, the use of STT-MRAM technology becomes more attractive.

Patterning of MRAM devices such as STT-MRAM may take place by defining a patterned mask formed on top of a stack of layers that contains at least two magnetic layers separated by an insulating layer. The patterned mask typically contains isolated mask features that expose regions of the substrate that lie between the mask features, which exposed regions are subsequently etched away through the stack of layers that constitute a memory device. After etching, isolated islands or pillars remain, which constitute individual memory bits. However, although direct etching has been adopted to define such memory devices, typical materials used in the stack of layers are difficult to etch. Moreover, after etching, the empty regions between the memory bits are filled with dielectric. Because the memory bit performance is extremely sensitive to the condition of the sidewall of the island, great care must be taken to clean and passivate the island sidewalls before the dielectric fill process is performed. It is with respect to these and other considerations that the present improvements have been needed.

SUMMARY

Embodiments are directed to methods and structures for improved MRAM device performance. In one embodiment a method of forming a magnetic memory includes providing a layer stack comprising a plurality of magnetic layers and a plurality of electrically conducting layers on a base portion of a substrate; forming a first mask feature on an outer surface of the layer stack above a first protected region and a second mask feature on the outer surface of the layer stack above a second protected region, the first mask feature and second mask feature defining an exposed region of the layer stack in portions of the layer stack therebetween; and directing ions towards the exposed region of the layer stack in an ion exposure that is effective to magnetically isolate the first protected region from the second protected region and to electrically isolate the first protected region from the second protected region without removal of the exposed region of the layer stack.

BRIEF DESCRIPTION OF THE DRAWINGS

FIGS. 4A to 4C present a side cross-sectional view of a substrate illustrating exemplary processes involved in MRAM device processing using ion implantation;

DETAILED DESCRIPTION

Figure 1A:
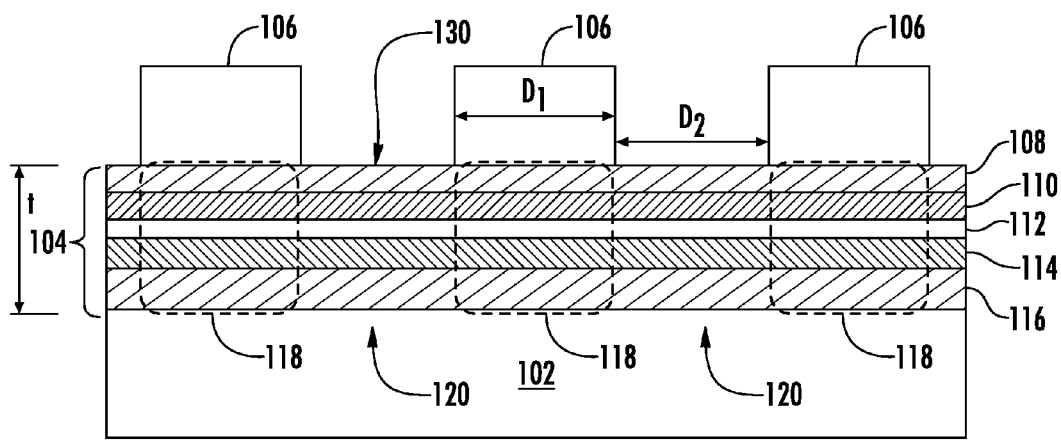
FIGS. 1A and 1B depict a side cross-sectional view of a substrate illustrating exemplary operations involved in MRAM device processing using ion implantation.

The present disclosure will now be described more fully hereinafter with reference to the accompanying drawings, in which some embodiments are shown. The subject of this disclosure, however, may be embodied in many different forms and should not be construed as limited to the embodiments set forth herein. Rather, these embodiments are provided so that this disclosure will be thorough and complete, and will fully convey the scope of the subject of this disclosure to those skilled in the art. In the drawings, like numbers refer to like elements throughout.

To solve the deficiencies associated with the methods noted above, novel techniques for patterning a substrate are introduced. In particular, the present disclosure focuses on techniques involving ion implantation processes for patterning magnetic storage structures, such as MRAM, and more particularly STT-RAM. The methods disclosed herein may employ ion implantation processes alone or in conjunction with masking processes to define multiple MRAM cells within an MRAM array, where each MRAM cell includes a specific stack of layers. However, those of ordinary skill in the art will recognize that the techniques disclosed herein are not limited to use in conjunction with any particular etching process of particular stack of layers that define an MRAM cell.

The embodiments are also described as techniques using ion based substrate processing systems. However, those of ordinary skill in the art will recognize that other types of sub-atomic, atomic, or molecular particle based substrate processing systems, including plasma processing, as well as beam line ion implantation systems used to produce such particles, are within the scope of the present disclosure.

In various embodiments, processes for patterning magnetic storage cells involve blanket implantation of a substrate that includes a base and a stack of layers that comprise an MRAM storage element or MRAM cell. In various embodiments, the MRAM cell may be fabricated from a stack of layers (also referred to herein as a "layer stack") that is the same or similar to that of conventional MRAM devices, including conventional STT-RAM devices. The substrate to be implanted may include mask features disposed on an outer portion of the stack of layers disposed on a substrate so as to act as a mask to screen ions being implanted into the substrate. In this manner, during a blanket implantation process, portions of the layer stack disposed underneath the patterned features may remain partially or wholly protected from the implanting ions, while those portions of the layer stack that are not protected by the mask features may be implanted with ions. Consistent with various embodiments, the dose and energy of implanting ions may be used to optimize the process of fabricating an MRAM cell structure, and thereby may optimize the properties of individual MRAM cells and/or an array of MRAM cells.

As detailed below, the present embodiments address challenges for patterning complex layer stacks to form device such as MRAM devices. In particular, the present embodiments provide ion implantation operations to achieve a novel approach for non-volatile memory fabrication. For the purposes of illustration in some embodiments the combination of layers used to form a non-volatile memory may be depicted for specific MRAM device configurations. However, the present embodiments are not limited to any specific combination of layers to be used to fabricate an MRAM cell. In various embodiments, a layer stack to form an MRAM cell may be fabricated upon a substrate base consistent with known techniques. The terms "substrate base," "base portion," or "underlayer" refer herein to any substrate that contains any set of layers and/or structures upon which a layer stack to form an MRAM cell is formed. As will be apparent to those of ordinary skill in the art, the substrate underlayer, or base (portion), need not be planar and may include multiple different structures on its surface. However, in the FIGs. to follow, the portions of a substrate base upon which a layer stack of the MRAM device is formed is depicted as planar.

In various embodiments, ion implantation is performed to define an array of MRAM cells without the need to remove layer stack material that is disposed between MRAM cells. This is accomplished by providing an ion treatment to exposed regions of a substrate that lie between MRAM cells to be defined where the ion treatment is effective to both magnetically isolate and electrically isolate MRAM cells from one another. In the following description, the terms "ion treatment" and "ion exposure" are generally used interchangeably, although the term "ion exposure" may be used to indicate one or more ion exposures. The term "electrically isolate" as used herein refers to eliminating any electrically conductive path between different MRAM cells. The term "magnetically isolate" refers to rendering magnetic material between features such as MRAM cells non-magnetic such that each MRAM cell constitutes an island of magnetic material surrounded by non-magnetic material or material of substantially reduced magnetism compared to that in the MRAM cell.

In the present embodiments, the ion treatment is effective to magnetically and electrically isolate MRAM cells from each other without removal of the exposed regions. In particular, the ion treatment alters the exposed regions thereby creating altered regions that may include a mixture of the materials that form the exposed layer stack. This mixture may include compounds or alloys formed from reaction of layer stack materials with implant species, isolated implant species, as well as altered layer stack material. In some examples, material from different layers of the layer stack may be mixed, and material within one or more layers of the layer stack may become agglomerated into islands. In some embodiments, material such as non-reactive metal species may be selectively removed from one or more layers of the layer stack, which may aid in electrical isolation of MRAM cells.

Figure 1B:
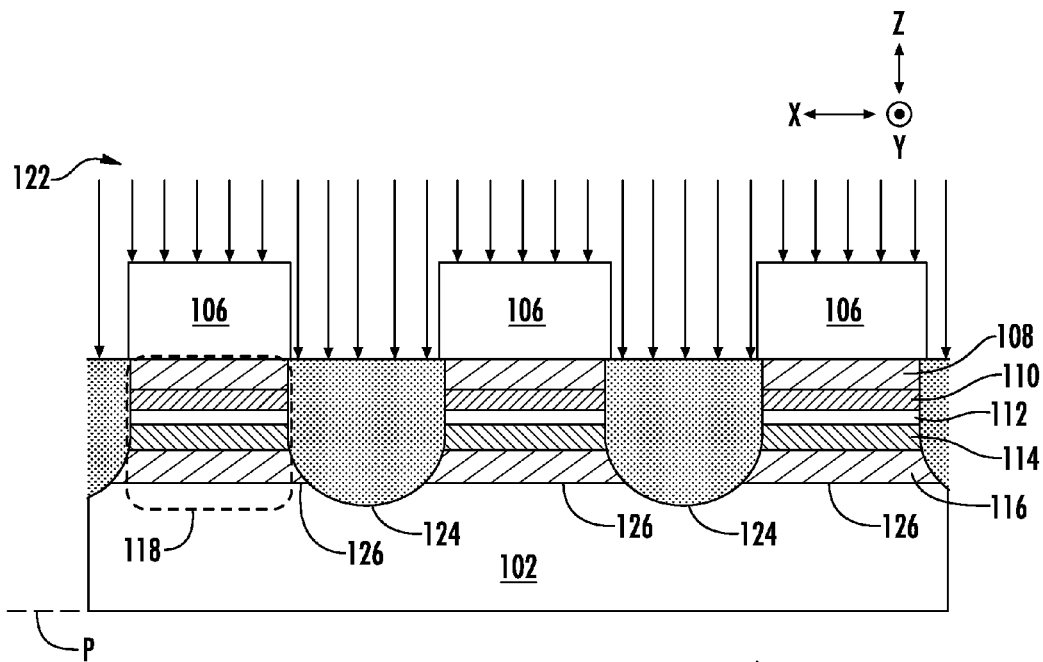
Figure 1C:
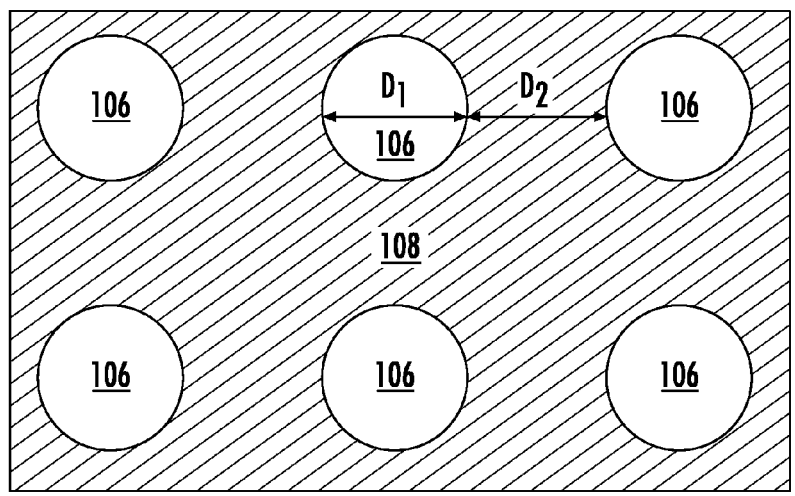
FIGS. 1C and 1D depict a top view of the device corresponding to the views of FIGS. 1A and 1B, respectively.

FIGS. 1A to 1D depict one embodiment of MRAM device processing using ion implantation. In particular, FIGS. 1A and 1C illustrate a respective side cross-sectional view and top plan view of a substrate 100 used to form an MRAM device. As illustrated, the substrate 100 includes a base portion or substrate base 102, which is electrically insulating, upon which a layer stack 104 that includes a plurality of layers is disposed. In order to define an MRAM device, a set of mask features 106 are provided on the substrate 100 as detailed below. In various embodiments the layer stack 104 includes a first magnetic layer and a second magnetic layer separated by an electrically insulating layer. The layer stack 104 may also include an electrically conductive layer(s) that is used to contact a respective magnetic layer. Of course the first magnetic layer and second magnetic layer may also be electrically conductive. In the specific embodiment shown in FIG. 1A, the layer stack 104 includes a fixed layer 110 that comprises a magnetic material, an electrically insulating layer 112, which may be MgO in some embodiments, a reference layer 114 that also comprises a magnetic material, and contact layers 108, 116, which are each an electrically conductive layer. Other layers within the layer stack 104 are not specifically depicted, but may include various additional layers including additional magnetic layers and contact layers, as will be apparent to one of ordinary skill in the art.

In the embodiment of FIG. 1A, mask features 106 are formed on the outer surface 130 of the layer stack 104 and partially mask the layer stack 104. The mask features 106 may be formed using any convenient process and may be a hard mask material in some embodiments. In various embodiments the mask features 106 may have any desired shape and may be arranged in any desired pattern. In the specific embodiment illustrated in FIG. 1C, the mask features 106 have a circular shape in plan view and are arranged in a two dimensional array. In the illustration of FIGS. 1A-1D the mask features 106 are depicted as a first mask feature, second mask feature, and third mask feature. However, it will be readily appreciated that the FIGS. 1A-1D only depict a portion of the substrate 100, which may comprise up to $10^6$-$10^{12}$ or greater number of mask features 106, where each mask feature 106 is used to define an MRAM cell in an MRAM device as detailed below.

After formation of the mask features 106 on the layer stack 104, the mask features 106 are used to define MRAM cells in portions of the stack of layers 104 that are disposed under the mask features 106. As shown in FIG. 1A, the mask features 106 define protected regions 118 (three of which are illustrated) having a width $D_1$ that lie within the layer stack 104 underneath each respective mask feature. When the substrate 100 is subjected to processing such as exposure to ions, the mask features 106 may attenuate the ions and prevent ions from impinging upon the protected regions 118. On the other hand, exposed regions 120 of the layer stack 104 having a width $D_2$ that lie between mask features 106 may be subject to ion implantation, etching, and other processes when ions are directed to the substrate 100.

Figure 1D:
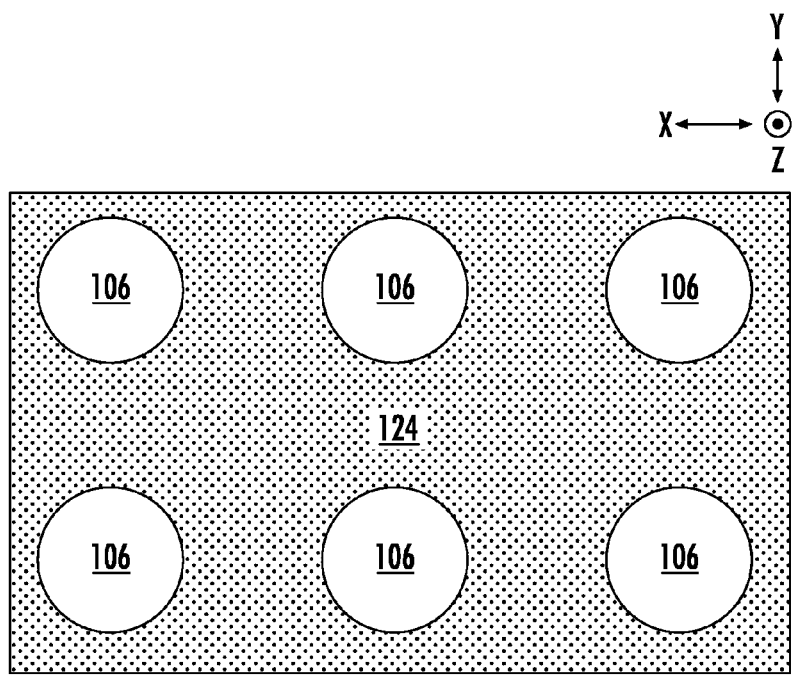

As illustrated in FIG. 1B and FIG. 1D, when the mask features 106 are in place, ions 122 are directed toward the substrate 100. The ions 122 implant into the substrate 100 including in unmasked regions as well as into mask features 106. It is to be noted that the dimensions of any of the individual layers, mask features, or other features are not necessarily depicted to scale with respect to one another in either the X-direction or Z-direction. For example, the thickness of the mask features 106 (in the Z-direction) may be relatively greater than the total thickness of the layer stack 104. Accordingly, the ion energy of ions 122 may be adjusted so that ions 122 implanting into mask features 106 may be attenuated within the mask features 106 without penetration to underlying portions of the layer stack 104. At the same time ions 122 that directly strike the layer stack 104 in exposed regions 120 where no mask feature 106 is present may penetrate through any desired thickness of the layer stack 104, including the entire thickness of the layer stack 104. The ions may be provided by a conventional beamline ion implantation system, a conventional plasma deposition (PLAD) apparatus, or any system for delivering ions to a substrate.

In various embodiments, including embodiments in which the ions 122 are produced in a beamline ion implantation system, the ions 122 may be directed as a substantially parallel beam of ions. In particular embodiments, the ions 122 may impinge upon the substrate 100 in a direction parallel to the Z-direction, that is, perpendicular to a plane P of the substrate 100 that lies along the X-direction. In this manner, the ions 122 that impinge upon the substrate 100 may define one or more implanted regions 124. In some embodiments, the implanted regions 124 may have similar or substantially the same dimension in the X- and Y-directions as that of the exposed regions 120. However, in some embodiments, the implanted regions 124 may have somewhat larger dimensions in the X- and Y-directions than that of the exposed regions 120, as discussed with respect to FIG. 8 below. In other embodiments, the implanted regions 124 may have somewhat smaller dimensions that the exposed regions 120. Moreover, the cross-sectional shape of the implanted regions 124 as shown in the X-Z plane of FIG. 1B (as well as in the Y-Z plane) may vary among different embodiments. Thus, as shown in FIG. 1B, the lower portion of implanted regions 124 may be curved, while in other embodiments the shape may be more rectangular, as shown in FIG. 4B, for example.

As previously noted, by proper choice of ion energy and ion dose the ions 122 may be attenuated by the mask features 106 such that the protected regions 118 are not subject to ion implantation. Since at least portions of the exposed regions 120 are transformed into implanted regions 124, which surround the protected regions 118, a given protected region 118 is isolated from other protected regions by implanted regions 124. In various embodiments, the ion species of ions 122, the ion energy, and ion dose of ions 122 are chosen such that the combination of ion species, ion energy, and ion dose render the implanted regions 124 magnetically "dead" after exposure to ions 122. This serves to magnetically isolate a protected region 118 from neighboring protected regions 118 so as to define a MRAM cell 126 whose size may be similar to that of protected regions 118. In the example of FIG. 1B, the width of MRAM cell 126 is approximately $D_1$ in upper portions towards the mask features 106, but increases towards the interface with the substrate base 102. However, in other embodiments, the width of an MRAM cell may be substantially uniform in the Z direction. The term "magnetically isolate" as used herein refers to transforming initially magnetic regions that surround a designated magnetic region, such as the protected region 118, into non-magnetic regions (magnetically dead regions). As illustrated in FIG. 1A, a magnetic region such at the protected region 118, may contain multiple layers, only some of which are magnetic. A magnetically isolated region having the proper stack of magnetic and non-magnetic layers may thereby form an MRAM cell that is isolated from other MRAM cells by the non-magnetic regions, such as implanted regions 124. Accordingly, by virtue of magnetically deadening the implanted regions 124, the size and shape of MRAM cells 126 are defined by the ion implantation process.

In some embodiments, conditions for ions 122 may be chosen such that the combination of ion species, ion energy, and ion dose may also render all of the portions of layer in the implanted regions 124 electrically insulating, thereby also preventing any electrical short circuits between adjacent MRAM cells. Thus, the ions 122 may both magnetically isolate and electrically isolate a given protected region 118 from other protected regions 118. Accordingly, after implantation of ions 122 the layer stack 104 between adjacent MRAM cells 126 need not be etched since each MRAM cell 126 is electrically isolated from each other MRAM cell. Regarding embodiments such as that depicted in FIG. 1A where the implanted regions 124 are not removed, it is to be noted that the required combination of ion dose/ion energy/ion species for magnetically deadening the exposed region may differ from a required combination for rendering the exposed region electrically insulating. Accordingly, the combination of ion/energy/ion dose/ion species to be used in such cases may be chosen based on the combination that performs both functions.

In the above manner, a novel magnetic memory structure is formed. An MRAM memory is formed by providing an ion exposure to a substrate that includes a layer stack patterned using mask features, such that the mask features define a set of protected regions separated by an exposed region, where the ion exposure is effective to magnetically isolate a first protected region from a second protected region and to electrically isolate the first protected region from the second protected region without removal of the exposed region of the layer stack. The term "without the removal of the exposed region" as used herein refers to the fact that the entire layer stack of an exposed region is not removed although a portion of the layer stack in an exposed region may be removed during MRAM processing.

Referring again to FIG. 1B, the final magnetic memory may include a memory device base (substrate base 102) and a plurality of memory cells (MRAM cell 126) that are disposed on the memory cell base, where each memory cell contains a layer stack. The layer stack in turn includes a plurality of magnetic layers and a plurality of electrically conductive layers arranged in a stack of layers common to each other memory cell. Thus, each layer stack of each MRAM cell 126 includes the layers 116, 114, 112, 110, 108 arranged in the same order. The magnetic memory also includes an implanted matrix (implanted regions 124) disposed between the memory cells and surrounding each memory cell, where the implanted matrix includes component material of the layer stack of each memory cell inter mixed with implanted species, the implanted matrix comprising a non-conducting material and a non-magnetic material, wherein each memory cell is electrically and magnetically isolated from each other memory cell. Thus, as shown in FIG. 1B, the implanted region 124 is a mixture of material from the original layer stack 104 together with ions 122 where, in contrast to the memory cells 126, the mixture is electrically insulating and non-magnetic (magnetically deadened). Although the top of implanted regions 124 is depicted as generally coplanar with the top of MRAM cells 126, in various embodiments disclosed herein below, the top or outer surface of the implanted regions (matrix) 124 may be higher, lower, or coplanar with the top of an MRAM cell. In addition, in some embodiments an implanted matrix (region) may have a concave shape in which the portions of the implanted matrix furthest from adjacent patterned mask features are lower than portions closer to the patterned mask features.

In some embodiments, in order to magnetically deaden the exposed regions of the layer stack 104, the ion dose of ions 122 is in the range of $2E15/cm^2$ to $5E17/cm.^2$ Examples of ions 122 include nitrogen, oxygen, phosphorous, silicon. In various embodiments the ion energy of implanting ions may be in the range of about 3 keV to about 60 keV and maybe tailored according to the implanting ion species and desired implant depth within the layer stack 104 for the implanting ion species.

Moreover, according to different embodiments the ions 122 may be provided as an ion treatment that is composed of one or more ion exposures. For example, an ion treatment may include two ion exposures: a first ion exposure using oxygen ions at a first ion energy and first ion dose; and a second ion exposure using nitrogen at a second ion dose and second ion energy, in which the second ion dose and/or second ion energy may differ from respective first ion dose and/or first ion energy. In this manner, different ion exposures may be tailored for different purposes. For example, a phosphorous ion exposure may be performed to implant phosphorous ions, which may be effective in particular to magnetically deaden exposed regions of the layer stack 104, and an oxygen ion exposure may be performed to implant oxygen ions, which may be effective to transform initially electrically conductive layers of the layer stack 104 into electrically insulating material, thereby electrically isolating protected regions 118 of layer stack 104. In particular variants, the phosphorous implantation may be performed prior to oxygen implantation, which may enhance the effectiveness of oxygen ion implantation in electrically isolating protected regions 118. The embodiments are not limited in this context.

An advantage of using ion implantation to define the size of an MRAM cell is that the MRAM cell dimensions may be precisely defined regardless of processing to take place subsequent to the ion implantation. Thus, consistent with various embodiments in which implantation is used to magnetically deaden exposed regions of a layer stack, the physical size and shape of an MRAM cell structure that is eventually formed after ion implantation does not determine the size of the magnetically active regions. This relaxes the requirements for subsequent processing of such devices. In addition, after the regions between mask features are exposed to ions to magnetically deaden the regions, such as the exposed regions 120, the size of portions that are rendered electrically insulating need not exactly correspond to the size of the magnetically deadened regions.

Figure 2:
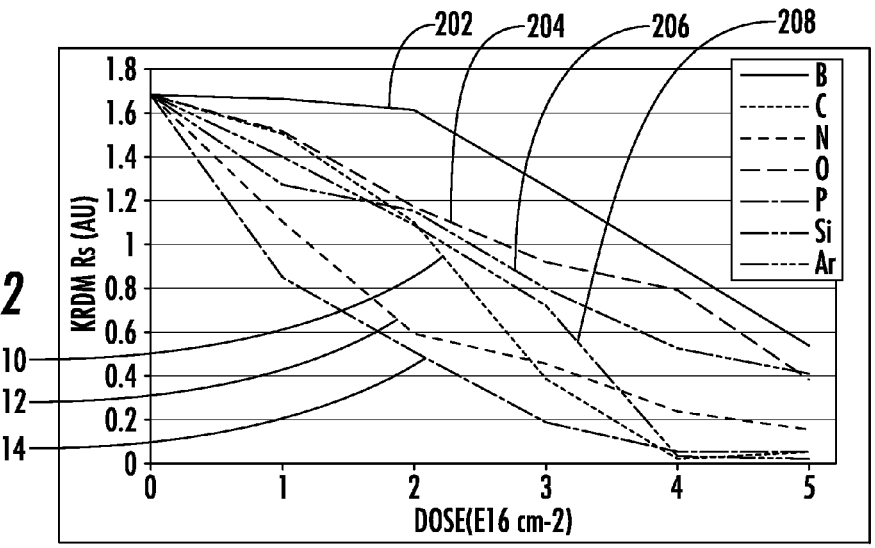
FIG. 2 presents a graph showing the effect of ion implantation of magnetic properties of a magnetic material.

Consistent with the present embodiments, the ion species, ion energy, and ion dose may be tailored to optimize the process of fabricating MRAM cells by ion implantation. FIG. 2 depicts experimental results that illustrate the effect of ion dose on magnetically deadening an initially magnetic layer. This data may be employed to optimize the MRAM fabrication process using ion implantation. In particular FIG. 2 presents the results of measured magnetization of a 12 nm thick film containing Co, Cr and Pt as a function of ion implant dose up to $5E16/cm^2$ for several different implanting species, including oxygen (curve 202), boron (curve 204), silicon (curve 206), argon (curve 208), carbon (curve 210), nitrogen (curve 212), and phosphorous (curve 214). For all species, the magnetization decreases monotonically with ion dose. At all ion doses phosphorous is observed to be more effective in reducing magnetization, and magnetization is substantially eliminated for a dose of $5E16/cm^2$ for phosphorous ions, as well as for argon and carbon. For other implanting species, magnetization is substantially reduced but not eliminated at $5E16/cm^2$. Accordingly, in the present embodiments, phosphorous ion implantation may be advantageously employed to fabricate MRAM device structures in layer stacks that include magnetic layers such as the cobalt-containing film of FIG. 2. This allows the ion dose of implanting species used to magnetically deaden exposed portions of a substrate to be minimized, since phosphorous implantation most rapidly destroys magnetization as a function of ion dose. However, other ion species may be used to magnetically deaden the exposed portions. For example, if the MRAM cells may properly function when the magnetic moment in exposed regions between MRAM cells is reduced by about ⅔ with respect to unimplanted regions, any of the species of FIG. 2 may provide adequate magnetic deadening at an ion dose of $5E16/cm^2$.

Although phosphorous implantation has been observed to provide efficient magnetic isolation of protected regions in a device structure, other species may be effective for producing electrical isolation of protected regions. For example, in principle several different species may be effective in transforming initially conducting material in a layer stack into electrically insulating compounds or electrically insulating alloys or amorphous mixtures. Accordingly, in various embodiments any convenient ion species may be used to implant into the substrate 100, where the ion species that is effective in transforming conductive materials of a layer stack such as cobalt or iron materials, into electrically insulating materials. An effective ion dose to accomplish this may range between $2E15/cm^2$ to $5E17/cm^2$ depending on the layer stack thickness t, (FIG. 1A) and composition of materials in the layer stack 104.

However, many layer stacks used for magnetic memories employ noble metals that are resistant to formation of compounds or alloys, and thereby may remain conducting even after being subjected to large ion doses. For example, magnetic materials such Co or Fe may form electrically insulating compounds when subject to oxygen implantation, while noble metal species (noble metals) such as platinum or ruthenium that are typically used as contact layers do not form electrically insulating phases when subject to ion implantation, such as oxygen ion implantation. Thus, because such metals may not be transformed into insulating materials it may be desirable to remove such materials from a layer stack. The present inventors were surprised to discover that a high ion dose of certain species is effective in selectively removing noble metals from within a layer stack. In one set of experiments, oxygen ions were implanted into a layer stack constructed from multiple platinum, tantalum, and manganese.

Figure 3A:
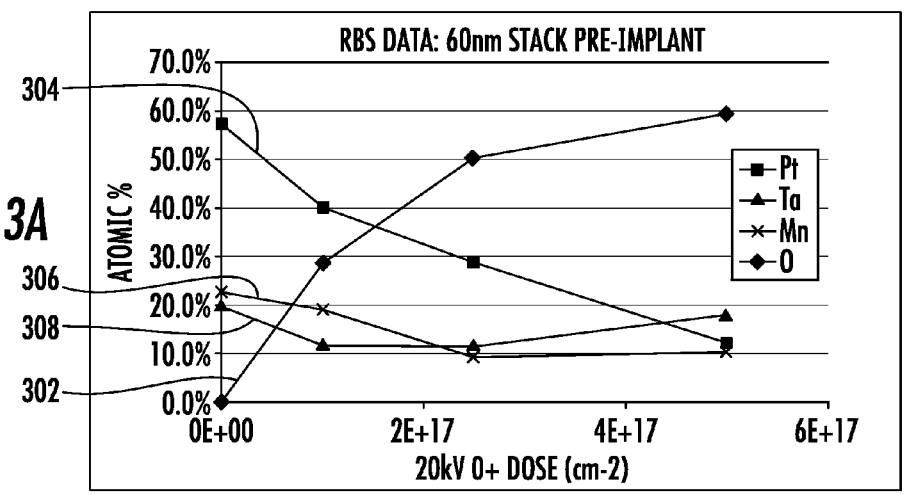
FIG. 3A presents a graph showing the effect of oxygen ion implantation on composition of a properties of a first layer stack.

FIG. 3A presents the results of compositional analysis of an exemplary layer stack as a function of oxygen ion dose. Before implantation, the layer stack constituted multiple layers each of platinum, tantalum, and manganese arranged to produce a total thickness of about 60 nm, and was electrically conducting. The oxygen ion dose implanted into the layer stack was increased up to 5 E17/cm$^2$ and resulting material was analyzed using Rutherford backscattering spectrometry (RBS) analysis. At zero dose, it can be seen that the overall Pt content (curve 304) of the multilayer layer stack is about 58%, the Mn content (curve 306) 22%, and Ta content (curve 308) 20%. As oxygen is implanted into the layer stack, the overall percent of each metal species decreases since oxygen content (curve 302) increases, reaching about 60% for a dose of 5 E17/cm$^2$. Notably, at an oxygen ion dose of 5 E17/cm$^2$ the % Pt decreases to about 12%, and the sample became electrically insulating as measured by four-point-probe. In addition, the RBS results indicated not only a relative decrease in the % Pt in the layer stack, but also an absolute decrease in the amount of Pt in the layer stack. This indicates that at least a portion of the original platinum content of the layer stack is etched during the implantation of oxygen ions. The etching may take place via physical sputtering, for example.

Regarding the curves 306, 308, although the % Mn and % Ta in the layer stack each decrease between the unimplanted state and an oxygen ion dose of 5 E17/cm$^2$ a large portion of this percentage decrease is due to the increase in oxygen content in the now-implanted layer stack. Moreover, although a portion of the original Ta and Co content may be removed from the layer stack, the RBS results indicated that Pt was preferentially removed from the layer stack, as compared to Mn and Ta, which were relatively less etched.

Figure 3B:
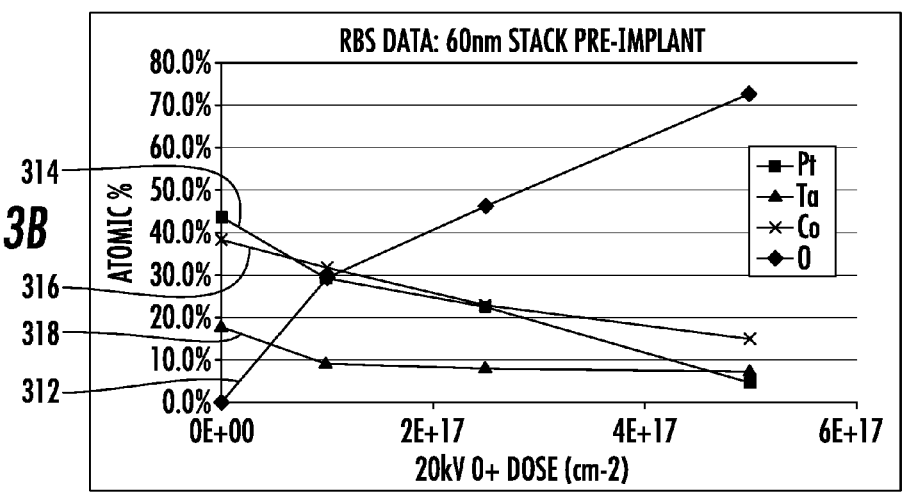
FIG. 3B presents a graph showing the effect of oxygen ion implantation on composition of a properties of a second layer stack.

This phenomenon was further investigated for a layer stack containing Pt, Ta, and Co. FIG. 3B presents the results of compositional analysis of such a layer stack as a function of oxygen ion dose. Before implantation, the layer stack constituted multiple layers each of platinum, tantalum, and manganese arranged to produce a total layer stack thickness of about 60 nm, where the total equivalent layer thickness of the Pt layers was about 26-27 nm, and was electrically conducting. The oxygen ion dose implanted into the layer stack was increased up to 5 E17/cm$^2$ and resulting material was analyzed using Rutherford backscattering spectrometry (RBS) analysis. At zero dose, it can be seen that the overall Pt content (curve 314) of the multilayer layer stack is about 45%, the Co content (curve 316) 38%, and Ta content (curve 318) 18%. As oxygen is implanted into the layer stack, the overall percent of each metal species decreases since oxygen content (curve 312) increases, reaching about 70% for a dose of 5 E17/cm$^2$. Notably, at an oxygen ion dose of 5 E17/cm$^2$ the % Pt decreases to about 5%, and the sample became electrically insulating as measured by four-point-probe. In addition, the RBS results indicated not only a relative decrease in the % Pt in the layer stack, but also an absolute decrease in the amount of Pt in the layer stack. This indicates that at least a portion of the original platinum content of the layer stack is etched during the implantation of oxygen ions. The etching may take place via physical sputtering, for example.

Regarding the curves 316, 318, although the % Co and % Ta in the layer stack each decrease by about a factor of two between the unimplanted state and an oxygen ion dose of 5 E17/cm$^2$ a large portion of this percentage decrease is due to the increase in oxygen content in the now-implanted layer stack. Moreover, although a portion of the original Ta and Co content may be removed from the layer stack, the RBS results indicated that Pt was preferentially removed from the layer stack. To confirm these results, cross-sectional transmission electron microscopy was performed on select samples exposed to varying amounts of oxygen ion implantation. Without oxygen ion implantation the layer stack included, among other layers, two buried Pt layers. When the layer stack was exposed to a dose of 2.5 E17/cm$^2$ oxygen ions, a single Pt layer was observed on an outer surface away from the substrate, indicating that the implantation of oxygen induces an unexpected outward diffusion of Pt toward the exposed surface of the stack of layers. When the layer stack was exposed to a dose of 5 E17/cm$^2$ oxygen ions, little Pt remains, dispersed in islands on the surface of the implanted layer stack, which is consistent with RBS results showing that Pt constitutes an overall fraction of about 5% of the implanted layer stack. In addition, the overall remaining thickness of the layer stack was observed to be about 40 nm, indicating that a substantial portion of the Ta and Co from the original layer stack remains.

Thus, the results of FIGS. 3A and 3B indicate that a metal such as Pt may be selectively removed from a layer stack when the layer stack is exposed to implanting ions, which induce an unexpected transport of Pt toward an outer (exposed) surface of the layer stack, causing a segregation of Pt in an outer surface region. Once Pt becomes segregated at an outer surface region of the layer stack, ions incident upon the layer stack may, in addition to implanting within the layer stack, cause sputtering of the Pt, resulting in removal of the Pt from the layer stack.

In various embodiments the above results reflected in FIGS. 2-3B may be harnessed by performing multiple ion exposures to fabricate and MRAM device, in which each implantation operation is tailored for a given result. For example, a first implant operation may effectively create magnetic isolation of MRAM cells by reducing or eliminating magnetization in exposed regions of the substrate. In one example, phosphorous ions may be implanted into exposed regions of a layer stack in a first ion dose in order to render the exposed regions non-magnetic. This may be followed by an ion exposure to render the exposed layer stack electrically insulating. In some examples, this may be accomplished by implanting a single species such as oxygen, which may generate an electrically insulating mixture that includes insulating alloys, insulating compounds, and/or non-conducting amorphous mixtures of components of the original layer stack and oxygen. In cases in which the exposed layer stack includes noble metals such as Pt, a high dose of oxygen may be employed in order to selectively remove the noble metal as described above. However, in other cases, multiple different ions may be employed to selectively remove a metallic species such as a noble metal. For example, a first ion dose containing oxygen ions may be directed to an exposed layer stack to cause migration of the noble metal to the outer surface of the exposed region of the layer stack. A second ion dose may be subsequently directed to the exposed layer stack to sputter the noble metal disposed on the outer surface of the exposed region. For example, heavy inert gas ions such as Xe may exhibit a much higher sputter yield for Pt than that of oxygen at a desired ion energy. Accordingly, Pt may be selectively removed from a layer stack by a two step ion exposure in which a first ion dose includes oxygen ions in sufficient quantity to oxidize metal components within the layer stack, such as Co, Mn, Ta, and at the same time to cause noble metal components such as Pt to segregate at an outer surface of the layer stack. A second ion dose may then be directed to efficiently sputter the surface-segregated metal using, for example, xenon or other high mass ion.

FIGS. 4A-4C depict one example of multiple ion exposure in which a first ion exposure, second ion exposure, and third ion exposure are used to form an MRAM structure consistent with various embodiments. In particular, FIGS. 4A to 4C present a side cross-sectional view of a substrate 400 at various instances during processing. In FIG. 4A, ions 404 are directed to the layer stack 104, which is patterned using the mask features 106. The ions 404 implant into exposed regions of the layer stack 104 and form the implanted regions 402. The ions 404 may be phosphorous ions that are implanted at a sufficient ion dose to render the implanted regions 402 non-magnetic. In FIG. 4B, ions 406 are directed to the substrate 400, which form the implanted regions 402B in exposed regions of the layer stack 104. The implanted regions 402B may include ions 404 and ions 406. In some embodiments, as particularly suggested in FIG. 4B, the original layer stack 104 may include a metal species such as Pt or Ru that does not readily form an insulating material. In one example, one or more of the layers 108-116 of layer stack 104 may include Pt. In such cases, the ions 406 may be provided to cause a Pt metal layer 408 to form at the outer surface 410 of the layer stack 104. Notably, after exposure to ions 406, the implanted regions 402B may contain a mixture of elements from the different layers 108-116, as well as ions 404 and 406. The implanted regions 402B may constitute an electrically insulating region. However, Pt from layers 108-116 may migrate outwardly and segregate to the outer surface 410 to form the layer 408. As shown in FIG. 4B, the portions of layer 108 that are disposed under adjacent mask features 106 are meant to form parts of different MRAM cells. However, those portions may be electrically connected to one another via the layer 408. Accordingly, in a subsequent operation shown in FIG. 4C ions 412 are directed to the substrate 400 in order to sputter material from layer 408. As shown in FIG. 4C, the ions 412 cause the removal of the layer 408, thereby removing an electrically conductive path between different MRAM cells and ensuring electrical isolation of adjacent MRAM cells 414, given that the implanted regions 402B are sufficiently electrically insulating. According, in FIG. 4C a hallmark of the implanted regions 402B is that they constitute an implanted matrix that a lesser concentration, if any, of the noble metal per unit area than that of the memory cells (MRAM cells 414).

It is to be noted that in the aforementioned embodiments an outer surface of the exposed regions, such as exposed regions 120, may be subject to sputtering, either inadvertently or deliberately, as a consequence of the exposure to ions 122, 404, 406, 408. It may be desirable to control or limit the degree of material removed from a layer stack and therefore to control the degree of sputtering that may accompany implantation of ions into the layer stack, either in a single ion exposure or in multiple ion exposures. In various additional embodiments a capping layer is employed to control the balance between ion implantation and sputtering of material that takes place in the layer stack.

Figure 5A:
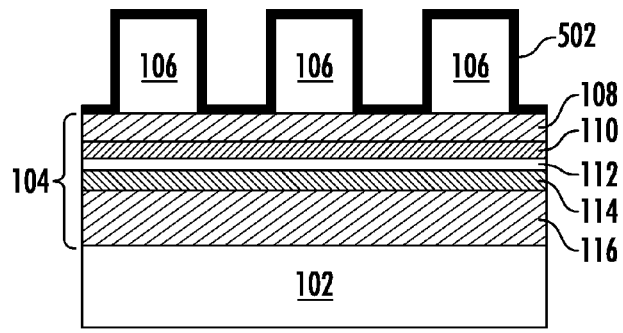
FIGS. 5A to 5D present a side cross-sectional view of a substrate illustrating exemplary processes involved in MRAM device processing using ion implantation.
Figure 5B:
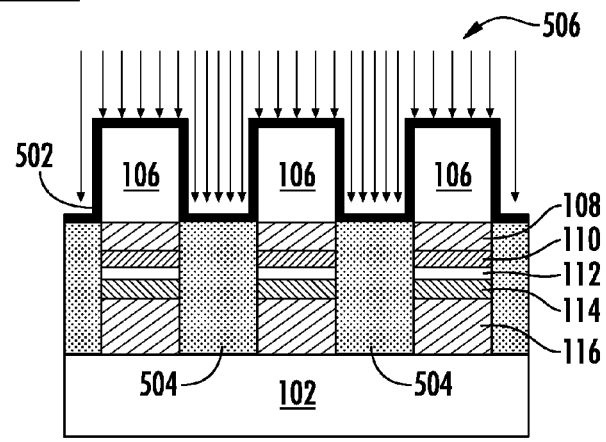
Figure 5C:
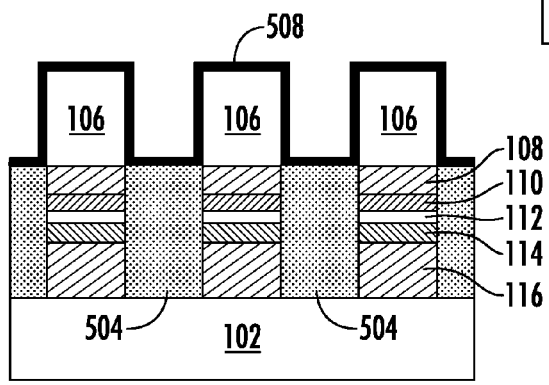

FIGS. 5A-5D depict one example of using a capping layer in conjunction with ion implantation to form an MRAM structure consistent with various embodiments. In particular, FIGS. 5A to 5D present a side cross-sectional view of a substrate 500 at various instances during processing. In FIG. 5A, mask features 106 are disposed upon a layer stack 104 as in FIG. 1A. A capping layer 502 is deposited on the substrate 500 including above regions of the layer stack 104 that lie between the mask features. The capping layer 502 may be a material such as carbon, silicon nitride or other material. In FIG. 5B, ions 506 are directed to the substrate 500 and penetrate through the capping layer 502. The ions 506 form implanted regions 504, which may extend through the entire thickness of the layer stack 104. In various embodiments the ions 506 are effective to transform magnetic material within the layer stack 104 into non-magnetic material and/or to transform electrically conductive material within the layer stack 104 into electrically insulating material. In some embodiments the ions 506 may represent multiple different species, such as phosphorous and oxygen, and may be provided in a single ion exposure or may be provided in separate ion exposures so that the exact dose of each species may be tailored.

Figure 5D:
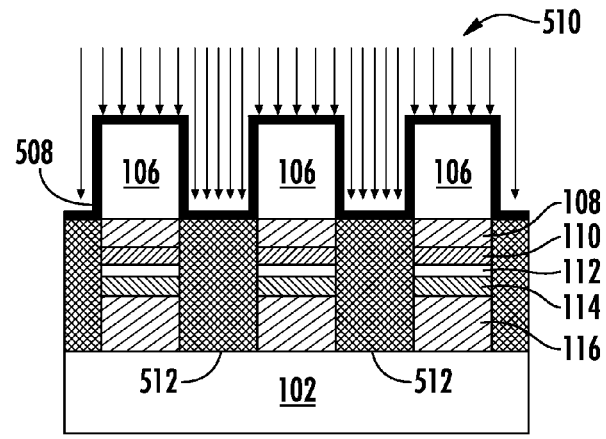

As a consequence of the exposure to ions 506, the capping layer 502 may be sputtered such that the thickness of the capping layer 502 decreases as shown in FIG. 5B. If the sputtering rate transforms the implanted region 504 into an electrically insulating and non-magnetic material without complete etching of the capping layer 502. Accordingly, the underlying implanted region 504 may be protected from sputter etching. However, in some cases the ion dose required to transform the implanted region 504 into an electrically insulating and non-magnetic material may entail complete sputter etching of a capping layer 502 for a given capping layer thickness. It may also be impractical to increase thickness of capping layer 502 to account for resputtering effects due to the increased ion energy required to penetrate a thicker capping layer, which may have deleterious effects including increased lateral scattering of implant damage into protected regions 118 (see FIG. 1A). Instead, consistent with an embodiment illustrated in FIGS. 5C and 5D, an additional capping layer 508 may be formed after the ion exposure to ions 506. In one example, the ions 506 may constitute an ion dose effective to render the implanted regions 504 non-magnetic but not sufficient to render the implanted regions 504 electrically insulating. In such case, after the additional capping layer 508 is formed on the substrate 500, an additional ion exposure to ions 510 is performed. The ions 510 may again sputter the capping layer 508 thereby reducing its thickness as shown in FIG. 5D. However, because the ions 510 are only needed to render implanted region 512 electrically insulating, the capping layer 508 may sustain the total ion dose of ions 510 without complete etching.

In various embodiments, multiple cycles of capping layer deposition and ion implantation may be performed to define MRAM cells. For example, a layer stack may require only a single capping layer followed by exposure to ions to magnetically deaden exposed regions, while the same layer stack may require multiple cycles of depositing capping layers and ion exposure to render the layer stack electrically insulating. In other embodiments, two or more different ion species may be directed simultaneously to a substrate covered by a capping layer in which one of the ion species is effective in magnetically deadening the layer stack while another ion species is effective in transforming the layer stack into an electrically insulating material. The simultaneous exposure to the different ion species may be provided in multiple cycles of ion implantation and capping layer deposition as needed.

Figure 6A:
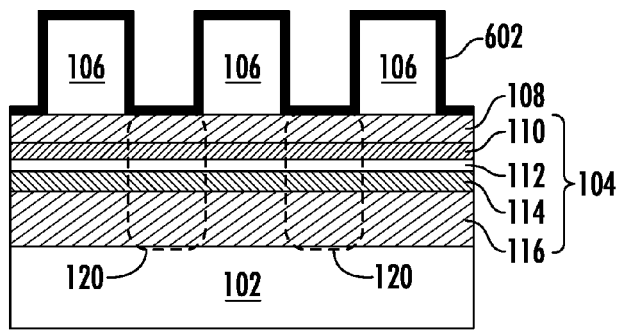
FIGS. 6A to 6D present a side cross-sectional view of a substrate illustrating exemplary processes involved in MRAM device processing using ion implantation.

FIGS. 6A-6D depict another embodiment of the use of a capping layer in conjunction with ion implantation to form an MRAM structure consistent with various embodiments. This embodiment affords the ability to selectively remove an unwanted metallic component from a layer stack without excessive change in the layer stack thickness in implanted regions of a substrate. In this example, mask features 106 are formed on an initial layer stack 104 that includes metallic material such as Pt. The presence of such metallic material may limit the ability to form electrically insulating regions between adjacent MRAM cells to be formed by ion implantation, as discussed above. Accordingly, the operations outlined in FIGS. 6A-6D are effective in removing such a metallic material while at the same time maintaining the outer surface of the layer stack at a desired level. In FIG. 6A a capping layer having a desired thickness is deposited upon the substrate 600.

Figure 6B:
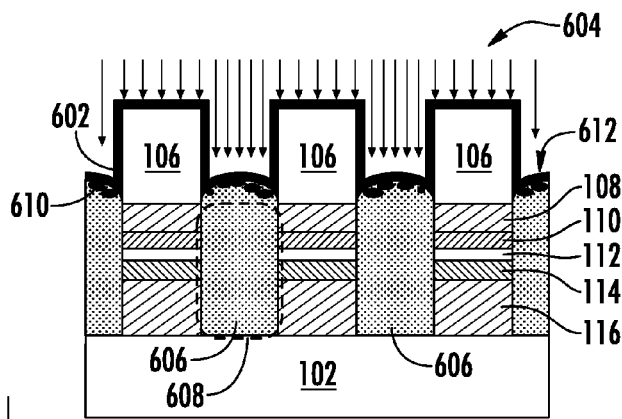
Figure 6C:
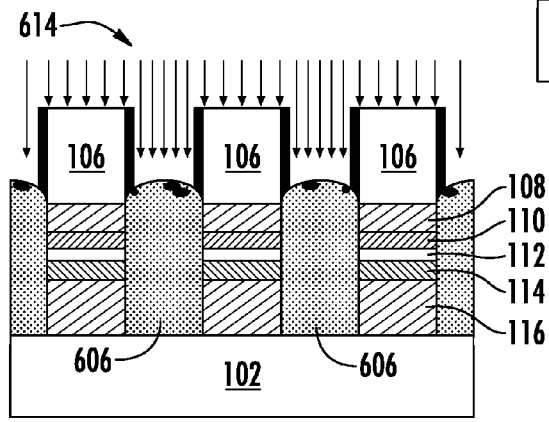

In FIG. 6B ions 604 are directed to the substrate 600. The ions 604, which may be provided in one or more ion exposures, and may include a single ion species or different ion species, result in the formation of implanted regions 606. The ions 604 may include ion species that are effective to magnetically deaden at least portions of the implanted regions 606. The ions 604 also may render lower portions 608 of the implanted regions 606 electrically insulating. As illustrated, the lower portions 608 of implanted regions 606 may constitute a region in which formerly distinct layers 108-116 are intermixed. The implanted regions 606 may include compounds, alloys, and/or amorphous mixtures of components of layers 108-116 together with implanted ions 604. In addition, as illustrated in FIG. 6B, the ions 604 cause the segregation of metallic material 610 towards the outer surface 612 of the layer stack 104. In one example, a portion of the ions 604 includes oxygen ions, which may form electrically insulating materials with certain metallic material within the layer stack 104, while additionally causing unreactive metals such as Pt to segregate to the outer surface 612 as metallic material 610.

Figure 6D:
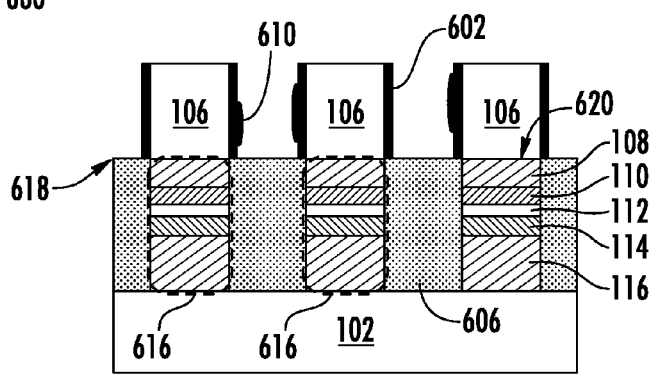

In some instances, the metallic material 610 may be disposed as isolated islands, as a continuous layer, as partially overlapping islands, or a combination of such structures. As such, the metallic material 610 may constitute an electrically conducting path between different unimplanted portions of the layer stack 104 disposed underneath mask features 106. Accordingly, in further processing illustrated in FIG. 6C, ions 614 are directed to the substrate 600 to remove any residual capping layer 602 and sputter metallic material 610 to remove the metallic material 610 from the region between mask features 106. The ions 614 may constitute high mass ions such as Xe, which are effective in generating surface sputtering while minimizing ion implantation, especially at relatively low ion energies in the range of a few keV or less. FIG. 6D shows an exemplary structure of the substrate 600 after processing with the ions 614. As illustrated, the substrate 600 includes multiple MRAM cells 616, which are magnetically and electrically isolated from one another. The remaining implanted regions 606 are electrically insulating and the metallic material 610 is removed from the implanted regions 606, rendering the MRAM cells 616 electrically isolated from one another. As shown in FIG. 6D, some metallic material 610 removed from the implanted regions 606 may redeposit upon sidewall portions of mask features 106. However, portions or all of mask features 106 may be removed in subsequent processing thereby eliminating metallic material 610 from the substrate 600.

It is further to be noted that the level 618 of the implanted regions 606 after ion implantation is complete may be adjusted by adjusting the relative thickness of capping layer 602, as well as the ion exposure provided by ions 604 and ions 614. As suggested in FIG. 6B the implanted region 606 may swell in dimension upon exposure to ions 604. Because the layer stack 104 may initially be composed mainly of metallic material, in order to render the implanted regions electrically insulating it may be necessary to implant a relatively high dose of ions 604. For example, a portion of the ions 604 may be oxygen that is used to form insulating compounds from metallic elements present in the layer stack 104. The stoichiometric ratio of oxygen to metal for many oxide compounds formed from a given metallic species typically is greater than or equal to one, indicating that the implanted region 606 may constitute 50% or greater oxygen content. Accordingly, when ions 604 are directed to the substrate, because the implanted region 606 is enclosed by the capping layer 602 thereby preventing loss of metallic material, the overall dimensions of the implanted region 606 may increase above that in the initial exposed regions 120 of the layer stack 104. The final position of level 618 may therefore be higher than-, the same as-, or lower than the level 620 of protected regions of MRAM device.

Figure 7A:
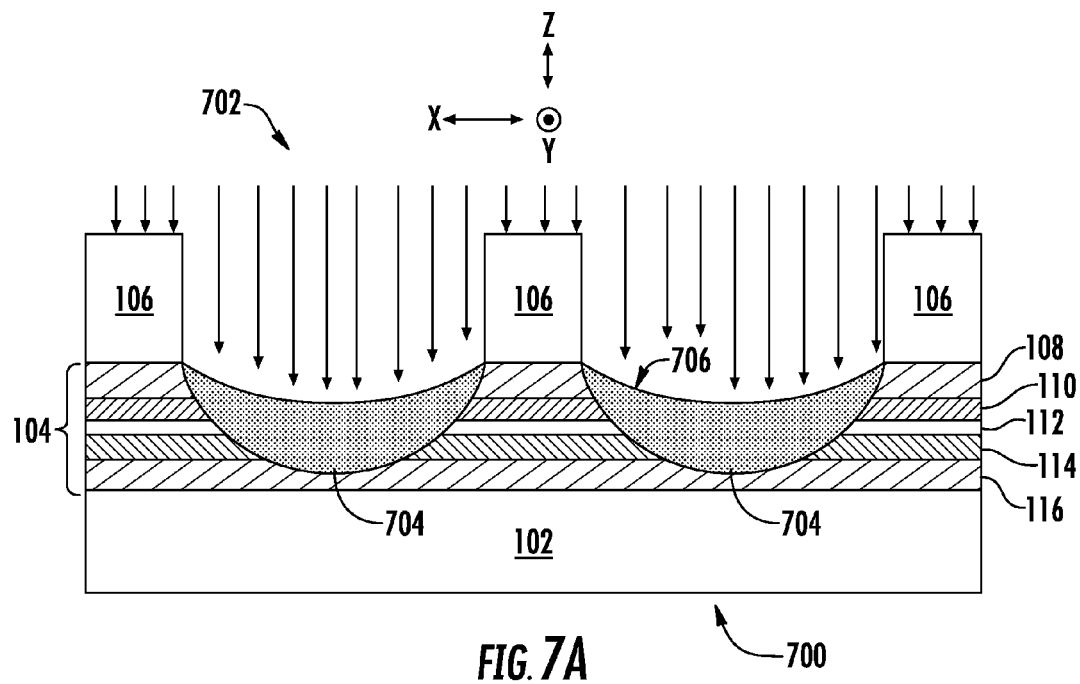
FIGS. 7A and 7B present a side cross-sectional view of a substrate illustrating an exemplary process for MRAM device processing using ion implantation.
Figure 7B:
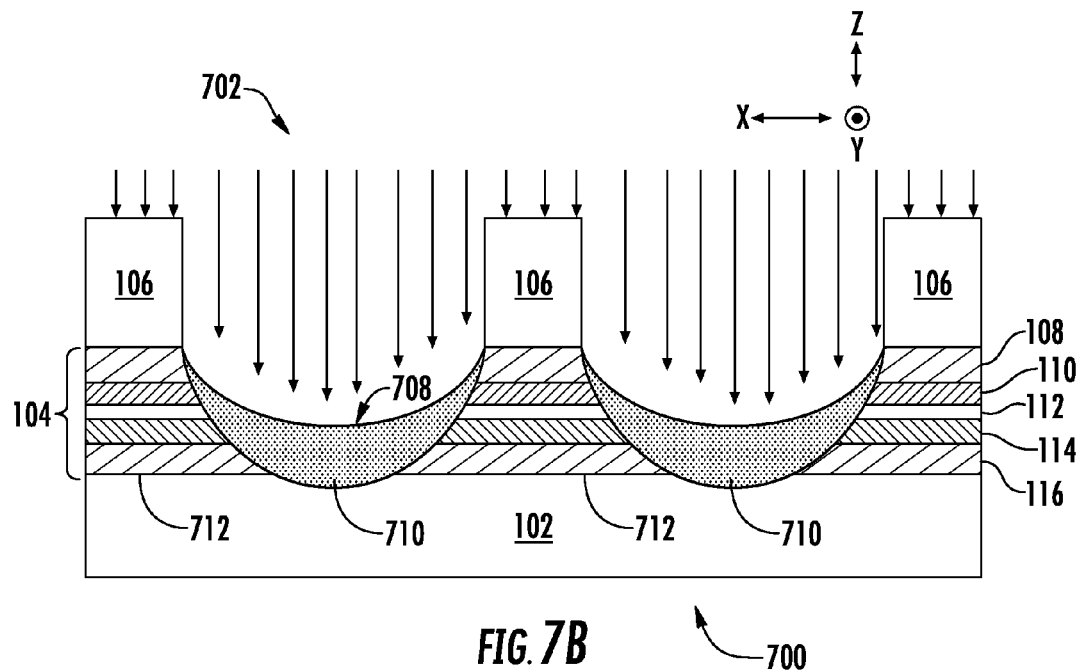

In additional embodiments, the shape of an implanted region between adjacent MRAM cells may be tailored to optimize processing of MRAM cells. FIGS. 7A and 7B depicts one embodiment in which an ion exposure of ions 702 are directed toward a substrate 700 to form concave shaped implanted regions that isolate MRAM cells. The FIGS. 7A and 7B depict the substrate 700 at different instances in the ion exposure. As shown in FIG. 7A after a first dose of ions 702, concave implanted regions 704 form within exposed portions of the layer stack 104. The top (outer) surface 706 of the implanted regions 704 has a concave shape such that the middle of the implanted region furthest from adjacent mask features 106 is recessed from its original position. However, the implanted region 704 does not completely extend through the layer stack 104 to the substrate base 102. In addition, after exposure to the first dose of ions 702 the implanted region 704 may not be completely electrically insulating and/or magnetically deadened. Accordingly, MRAM cells may not yet be completely defined because portions of the layer stack disposed under mask features 106 are not electrically or magnetically isolated from one another.

At a further instance shown in FIG. 7B, an additional dose of ions 702 is provided such that the top surface 708 of the implanted region 710 is further recessed and the implanted region 710 now extends throughout the layer stack 104. The accumulated dose of ions 702 is also sufficient to electrically and magnetically isolate MRAM cells 712 from one another. In this example, the MRAM cells 712 have a more tapered cross-sectional shape as viewed in the X-Z plane. The unexpected concave shape of the top surface 708 after ion implantation has been observed by the present inventors in particular when phosphorous and/or arsenic is used as the implant species, that is, ions 702. One benefit of the "crescent moon" shape of the implanted region 710 thus formed is that sidewall regions of the MRAM cells adjacent to the layers 108-116 are not exposed and are thus protected from attack during processing. This allows, for example, some sputtering of the layer stack 104 to be performed without concern for possible redeposition along exposed sides of MRAM layers since any deposit may rest upon the implanted inactive region, that is, implanted region 710. In turn, the ability to remove a portion of materials of the layer stack 104 by sputtering facilitates the use of a lower ion dose to accomplish magnetic and/or electrical isolation. For example, in a second ion exposure to create the electrical isolation of MRAM cells 712, a lower oxygen ion dose may be employed to oxidize the lesser amount of metallic material remaining in the layer stack 104. In some embodiments, it may be optimal to deposit a capping layer before the second ion exposure to control the position of the level of top surface 708 as described above.

Figure 8:
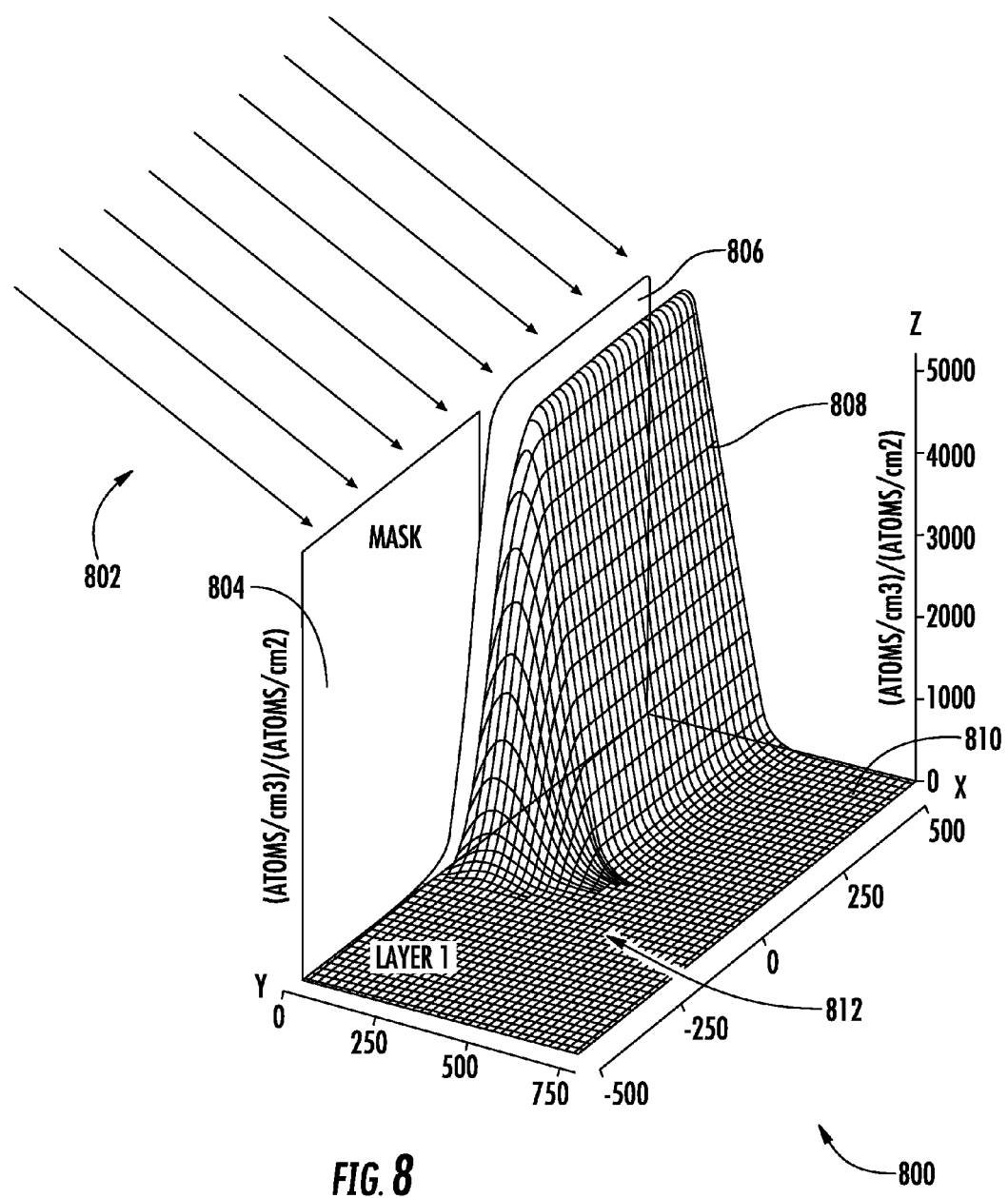
FIG. 8 presents view of a substrate and implanted species distribution illustrating exemplary results of MRAM device processing using ion implantation.

In further embodiments, in order to define the desired MRAM memory cell size, the mask features that define MRAM cells are designed to accommodate the lateral range of the implanted species that results when ions are implanted into exposed regions of a stack of layers. FIG. 8 depicts a composite illustration showing a perspective view of a masked substrate subject to ion implantation and a simulated concentration profile showing ion implantation species concentration as a function of position with respect to a mask. Ions 802 are directed toward the substrate 800 and blocked by the mask feature 804. In the exposed region 806 the ions 802 may penetrate into a layer stack 810, resulting in the implanted species distribution 808. In this example, because of masking effects, an ion dose at the edge of the mask feature 804 is about one half that of the peak in the middle of the exposed region 806. In addition, the lateral range is about 6 nm indicating that a portion of ions 802 come to rest under the mask feature 804 some 6 nm or greater from the mask edge. The implanted species concentration falls to zero as a function of position along the X-axis gradually. This results in a "fuzzy interface" between a memory bit defined under the mask 804 and the implanted exposed region 806, the "fuzzy interface" having a concentration of implanted species between zero and the concentration in the exposed region 806. Consistent with the present embodiments, this issue is addressed by arranging the lateral dimensions of the mask feature 804 to be larger than the design MRAM cell size. For example, the width of the mask feature 804 (and width of other like mask features 804) may exceed a design width of an MRAM cell. This may be accomplished by known lithography techniques or by depositing a conformal film over the mask feature 804, which results in spacing the implanting species laterally from the desired MRAM cell underneath the mask feature 804 by an amount approximately equal to the conformal film thickness.

It is to be noted that in the aforementioned embodiments in which multiple different ion exposures are provided to a substrate the order of ion exposures may vary unless otherwise specified. However, consistent with additional embodiments, two or more ion exposures may be performed in a preset sequence in order to optimize the final MRAM device. In particular embodiments, a first ion exposure containing phosphorous ions is performed before a second ion exposure containing oxygen ions. The phosphorous ion exposure may be used to magnetically deaden exposed regions of a patterned substrate as described above. However, by virtue of implanting phosphorous into the exposed regions before the oxygen, the implanted phosphorous species may act as gettering species that generated gettering sites for oxygen as the oxygen is implanted in a subsequent ion exposure. This has the effect of limiting diffusion of implanted oxygen species thereby reducing unwanted diffusion of oxygen into protected regions that are to constitute an MRAM memory bit (cell). In further embodiments, other ions may be implanted into exposed regions to act as gettering sites.

In still further embodiments, ion exposures may be performed upon cooled substrates in which active cooling is provided to the substrate to maintain substrate temperature at about room temperature or below. This has the effect of reducing diffusion of implanting species including lateral diffusion into the MRAM cell, since diffusion rates generally increase exponentially with increased temperature.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of forming a magnetic memory, comprising:
   providing a layer stack comprising a plurality of magnetic layers and a plurality of initially electrically conducting layers on a base portion of a substrate;
   forming a first mask feature on an outer surface of the layer stack above a first protected region and a second mask feature on the outer surface of the layer stack above a second protected region, the first mask feature and second mask feature defining an exposed region of the layer stack in portions of the layer stack therebetween; and
   directing ions towards the exposed region of the layer stack in an ion exposure that is effective to selectively remove a metallic species from an initially electrically conductive layer of the plurality of the initially electrically conductive layers of the layer stack, by causing transport of the metallic species toward an outer surface of the layer stack, wherein the initially electrically conductive layer becomes electrically insulating.

2. The method of claim 1, wherein the ion exposure comprises:
   a first ion exposure effective to cause migration of the metallic species to an outer surface of the exposed surface region of the layer stack; and
   a second ion exposure to sputter the metallic species from the outer surface of the exposed region of the layer stack.

3. The method of claim 2, further comprising directing ions to the layer stack in a third ion exposure that is effective to magnetically isolate the first protected region from the second protected region.

4. The method of claim 3 wherein the third ion exposure takes place before the first ion exposure and second ion exposure.

5. The method of claim 3 wherein the first ion exposure comprises oxygen ions, the second ion exposure comprises inert gas ions, and the third ion exposure comprises phosphorous ions.

6. The method of claim 1, wherein the ion exposure is effective to electrically isolate the first protected region from the second protected region.

* * * * *